(12) United States Patent
Dias et al.

(10) Patent No.: US 10,468,357 B2
(45) Date of Patent: Nov. 5, 2019

(54) STRETCHABLE ELECTRONICS FABRICATION METHOD WITH STRAIN REDISTRIBUTION LAYER

(71) Applicant: Intel Corporation, Santa Clara, CA (US)

(72) Inventors: Rajendra C. Dias, Phoenix, AZ (US); Tatyana N. Andryushchenko, Beaverton, OR (US); Mauro J. Kobrinsky, Portland, OR (US); Aleksandar Aleksov, Chandler, AZ (US); David W. Staines, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/546,958

(22) PCT Filed: Mar. 11, 2015

(86) PCT No.: PCT/US2015/019981
§ 371 (c)(1),
(2) Date: Jul. 27, 2017

(87) PCT Pub. No.: WO2016/144356
PCT Pub. Date: Sep. 15, 2016

(65) Prior Publication Data
US 2018/0019213 A1    Jan. 18, 2018

(51) Int. Cl.
*H01L 23/498* (2006.01)
*H01L 23/00* (2006.01)
(Continued)

(52) U.S. Cl.
CPC ........ *H01L 23/562* (2013.01); *H01L 21/4853* (2013.01); *H01L 21/565* (2013.01);
(Continued)

(58) Field of Classification Search
CPC ... H01L 23/562; H01L 23/16; H01L 23/3114; H01L 23/49838; H01L 23/4985
See application file for complete search history.

(56) References Cited

U.S. PATENT DOCUMENTS 6,144,108 A * 11/2000 Ohizumi ................ C09J 179/00
                                                                257/666
7,906,845 B1 * 3/2011 Galloway ............... H01L 23/04
                                                                257/707

(Continued)

FOREIGN PATENT DOCUMENTS

| CN | 102460690 | 5/2012 |
|---|---|---|
| CN | 102607938 | 7/2012 |
| CN | 10478431 | 10/2014 |

OTHER PUBLICATIONS

Non-Final Office Action for Taiwan Patent Application No. 105103609 dated Jun. 9, 2017, 11 pgs., with English translation.

(Continued)

*Primary Examiner* — Nathan W Ha
(74) *Attorney, Agent, or Firm* — Schwabe,Williamson & Wyatt, P.C.

(57) ABSTRACT

Embodiments of the invention include a microelectronic device and methods for forming a microelectronic device. In an embodiment, the microelectronic device includes a semiconductor die that has one or more die contacts that are each electrically coupled to a contact pad by a conductive trace. The semiconductor die may have a first elastic modulus. The microelectronic device may also include an encapsulation layer over the semiconductor die and the conductive trace. The encapsulation layer may have a second elastic modulus that is less than the first elastic modulus. The microelectronic device may also include a first strain redistribution layer within the encapsulation layer. The first strain redistribution layer may have a footprint that covers the semi- (Continued)

conductor die and a portion of the conductive traces. The strain redistribution layer may have a third elastic modulus that is less than the first elastic modulus and greater than the second elastic modulus.

21 Claims, 6 Drawing Sheets

(51) Int. Cl.
  *H01L 23/16*    (2006.01)
  *H01L 21/48*    (2006.01)
  *H01L 21/56*    (2006.01)
  *H01L 23/31*    (2006.01)

(52) U.S. Cl.
  CPC .......... *H01L 23/16* (2013.01); *H01L 23/3114* (2013.01); *H01L 23/4985* (2013.01); *H01L 23/49838* (2013.01); *H01L 24/16* (2013.01); *H01L 24/48* (2013.01); *H01L 23/3121* (2013.01); *H01L 24/49* (2013.01); *H01L 2224/05554* (2013.01); *H01L 2224/16* (2013.01); *H01L 2224/16227* (2013.01); *H01L 2224/48091* (2013.01); *H01L 2224/48227* (2013.01); *H01L 2224/49175* (2013.01); *H01L 2924/069* (2013.01); *H01L 2924/0715* (2013.01); *H01L 2924/181* (2013.01); *H01L 2924/186* (2013.01); *H01L 2924/18165* (2013.01); *H01L 2924/35121* (2013.01)

(56) References Cited

U.S. PATENT DOCUMENTS

| | | | | |
|---|---|---|---|---|
| 7,919,853 | B1* | 4/2011 | Lee | H01L 21/568 257/700 |
| 2002/0063326 | A1* | 5/2002 | Nakashima | H01L 21/565 257/704 |
| 2003/0085465 | A1* | 5/2003 | Kajimoto | G06K 19/077 257/734 |
| 2004/0183167 | A1* | 9/2004 | Hortaleza | H01L 23/13 257/666 |
| 2008/0257589 | A1 | 10/2008 | Ostmann et al. | |
| 2009/0317639 | A1 | 12/2009 | Axisa et al. | |
| 2010/0151628 | A1* | 6/2010 | Kushima | H01L 21/30625 438/113 |
| 2012/0052268 | A1 | 3/2012 | Axisa et al. | |
| 2013/0249075 | A1* | 9/2013 | Tateiwa | H05K 1/185 257/734 |
| 2013/0271929 | A1* | 10/2013 | Malatkar | H05K 1/0271 361/748 |
| 2014/0054760 | A1* | 2/2014 | Yu | H01L 23/34 257/692 |
| 2014/0220422 | A1 | 8/2014 | Rogers et al. | |
| 2014/0240932 | A1 | 8/2014 | Hsu | |
| 2014/0252591 | A1* | 9/2014 | Yu | H01L 21/50 257/729 |
| 2014/0291853 | A1* | 10/2014 | Lin | H01L 23/49827 257/774 |
| 2014/0339956 | A1* | 11/2014 | Kanae | H03H 9/1071 310/311 |
| 2016/0079094 | A1* | 3/2016 | Zhou | H01L 21/565 257/787 |
| 2016/0111345 | A1* | 4/2016 | Kawase | H01L 23/36 307/10.1 |
| 2016/0233202 | A1* | 8/2016 | Komo | H01L 23/00 |
| 2016/0240481 | A1* | 8/2016 | Chen | H01L 23/5389 |
| 2016/0246337 | A1* | 8/2016 | Colgan | H01L 24/97 |
| 2016/0247736 | A1* | 8/2016 | Kuwahara | H01L 23/62 |
| 2017/0352629 | A1* | 12/2017 | Fukumoto | H01L 23/48 |

OTHER PUBLICATIONS

International Preliminary Report on Patentability for PCT Patent Application No. PCT/US2015/019981 dated Sep. 21, 2017, 11 pgs.
International Search Report for PCT Patent Application No. PCT/US2015/019981 dated Nov. 30, 2015, 3 pgs.
Written Opinion for PCT Patent Application No. PCT/US2015/019981 dated Nov. 30, 2015, 9 pgs.
Office Action from Taiwan Patent Application No. 105103609, dated Apr. 22, 2019, 5 pages.
Office Action from Chinese Patent Application No. 201580075836.0, dated Aug. 26, 2019, 7 pages.

* cited by examiner

STRETCHABLE ELECTRONICS FABRICATION METHOD WITH STRAIN REDISTRIBUTION LAYER

CROSS-REFERENCE TO RELATED APPLICATION

This patent application is a U.S. National Phase Application under 35 U.S.C. § 371 of International Application No. PCT/US2015/019981, filed Mar. 11, 2015, entitled "STRETCHABLE ELECTRONICS FABRICATION METHOD WITH STRAIN REDISTRIBUTION LAYER," which designates the United States of America, the entire disclosure of which is hereby incorporated by reference in its entirety and for all purposes.

TECHNICAL FIELD

Embodiments of the invention are in the field of semiconductor structures and processing and, in particular, processes and apparatuses for packaging semiconductor devices on stretchable substrates.

BACKGROUND

Electronic devices are increasingly being incorporated into stretchable and/or wearable products. Applications such as medical sensors, media players, personal computers, or the like are being integrated into materials such as shirts, watches, caps, or any other compliant products. Typically, electronics that are incorporated into a stretchable and/or wearable products include a thin silicon die that is connected to conductive traces on a stretchable substrate.

An exemplary stretchable device 100 is illustrated in FIG. 1A. Stretchable device 100 includes a semiconductor die 120 formed on a stretchable substrate 110. The stretchable substrate 110 has a low elastic modulus that allows the device to stretch. For example, a suitable material for the stretchable substrate 110 may be polydimethylsiloxane (PDMS). Electrical components, such as processors, sensors, memory devices, or the like, may be formed on the semiconductor die 120. The semiconductor die 120 may be attached to a surface of the stretchable substrate 110 or encapsulated within the stretchable substrate 120. Die contacts 142 are each electrically coupled to a contact pad 144 with a wire bond 147. The interconnect pads 144 may be coupled to the contact pads 146 by a interconnect line 149. Since the interconnect lines 149 are typically formed with a ridged material, such as copper or other conductive stack of materials, the interconnect lines 149 may be formed in a meandering pattern. The meandering pattern allows for the interconnect lines 149 to be stretched without fracturing, similar to a spring.

However, stretchable devices are susceptible to damage during cyclic stretching, such as fracture or plastic deformations of the wire bonds 147 between the die contacts 142 and the interconnect pads 144, or in the interconnect lines 149 proximate to where there is a transition between the semiconductor die 120 and stretchable substrate 110. Such fractures 155 are illustrated in FIG. 1B. FIG. 1B is an illustration of the stretchable device 100 in the stretched state (as indicated by the arrows F) during one stretching cycle of a cyclical stretching process. The root cause of the failure is the sharp transition between the high modulus of the semiconductor die 120 and the low modulus of the stretchable substrate 110. The cumulative strain damage during cyclic stretching causes fractures 155 of the interconnections.

DESCRIPTION OF THE EMBODIMENTS

Described herein are systems that include a substrate with multiple layers with varying compositions and methods of depositing and patterning such layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include stretchable devices and methods of making such devices. In order to minimize the potential for failure of the devices due to fracturing of the interconnect path between die contacts and contact pads or tearing of the stretchable substrate due to cyclic stretching, embodiments of the invention include one or more strain redistribution layers. As described above, this failure of stretchable devices due to cyclic stretching is largely attributable to the difference between the elastic modulus of the semiconductor die and the elastic modulus of the stretchable substrate. When the stretchable device stretches, a high concentration of stress is formed in the interconnects proximate to the edge of the semiconductor die. Accordingly, embodiments of the invention utilize one or more strain redistribution layers in order to provide a more gradual transition from the relatively high modulus of the semiconductor die to the relatively low modulus of the stretchable substrate. The redistribution of the stress decreases the probability that the device will fail from fracture of the interconnect lines or tearing of the stretchable substrate due to cyclically induced stress during the stretching of the stretchable device.

Figure 1A:
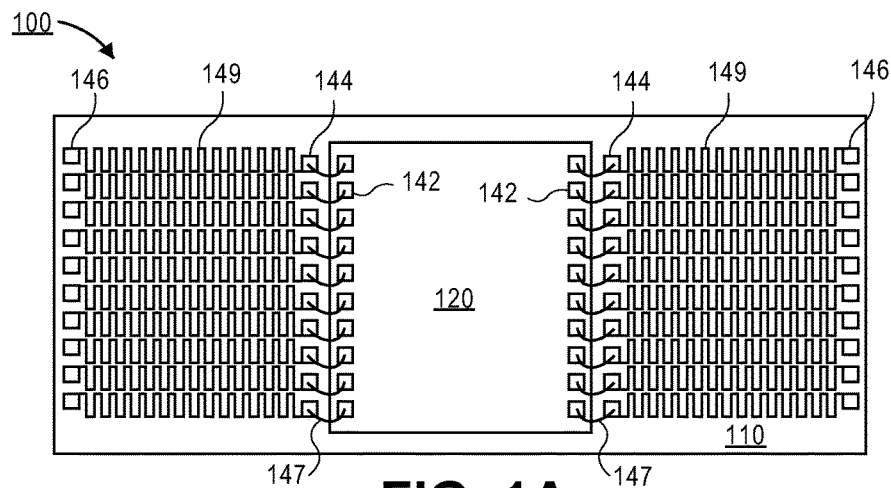
FIG. 1A is an overhead view of a stretchable device that includes a semiconductor die encapsulated in a stretchable substrate.
Figure 1B:
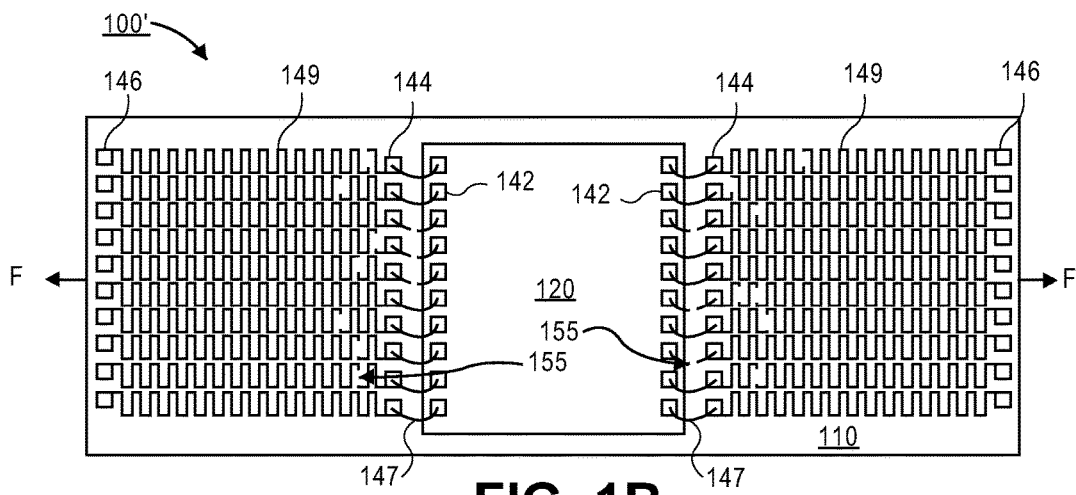
FIG. 1B is an overhead view of the stretchable device in FIG. 1A after the device has been cyclically stretched and a plurality of fractures have formed in interconnect lines and wire bonds.
Figure 2:
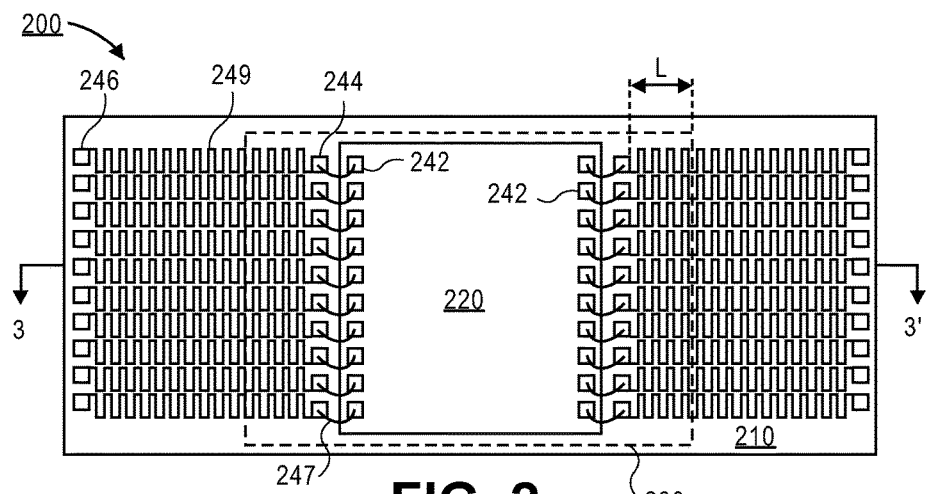
FIG. 2 is an overhead view of a stretchable device that includes a wire-bonded semiconductor die and a strain redistribution layer encapsulated in a stretchable substrate, according to an embodiment of the invention.

Referring now to FIG. 2, a plan view a stretchable device 200 is illustrated, according to an embodiment of the invention. As illustrated, the stretchable device 200 is formed on a stretchable substrate 210. The stretchable substrate is a compliant material that allows for the stretchable device 200 to stretch, flex, bend, twist, etc. The compliant nature of the stretchable substrate 210 may be attributable to a low modulus. For example, the elastic modulus of the stretchable substrate 210 may be less than approximately 10 MPa. In an exemplary embodiment, the elastic modulus of the stretchable substrate 210 may be between approximately 100 kPa and 10 MPa. By way of example, the stretchable substrate 210 may be polydimethylsiloxane (PDMS) or polyurethane.

The stretchable device 200 also includes one or more semiconductor dies 220. In the illustrated embodiment, the stretchable device 200 includes a single semiconductor die 220, however embodiments are not limited to such configurations. For example, two or more semiconductor dies 220 may be included in the stretchable device 200. The semiconductor die 220 includes one or more electrical devices (not shown). For example, the electrical devices may include one or more of a processor, a memory component, a sensor, a microelectromechanical system (MEMS), or the like, or any combination thereof. In an embodiment the semiconductor die 220 may be a system-on-a-chip (SoC).

The semiconductor die 220 may be a crystalline substrate formed using a bulk silicon or a silicon-on-insulator substructure. In other implementations, the semiconductor die 220 may be formed using alternate materials, which may or may not be combined with silicon, that include, but are not limited to, germanium, indium antimonide, lead telluride, indium arsenide, indium phosphide, gallium arsenide, indium gallium arsenide, gallium antimonide, or other combinations of group III-V or group IV materials. Although a few examples of materials from which the semiconductor die may be formed are described here, any material that may serve as a foundation upon which a semiconductor device may be built falls within the scope of the present invention. According to an embodiment, a modulus of the semiconductor die 220 may be approximately two orders of magnitude greater than a modulus of the stretchable substrate 210. For example, the elastic modulus of the semiconductor die 220 may be greater than approximately 100 GPa. In an embodiment, the elastic modulus of the semiconductor die 220 may be between approximately 100 GPa and 120 GPa.

According to an embodiment, the semiconductor die 220 is a wire-bonded semiconductor die. Wire bonds 247 electrically couple die contacts 242 to interconnect pads 244. The wire bonding structure of the stretchable device 200 may be substantially similar to those presently known in the art. For example, the die contact 242 and the interconnect pads 244 may include a conductive stack of materials, such as, but not limited to adhesion promoters, seed layers, copper, silver, gold, or alloys thereof, and oxidation inhibitors. The wire bonds 247 may be any commonly used conductive material, such as copper, silver, gold, or alloys thereof. While a wire-bonded semiconductor die is illustrated in FIG. 2, it is to be appreciated that the semiconductor die is not limited to wire-bonding, and other interconnect structures, such as a flip-chip semiconductor die, are also within the scope of embodiments of the invention. An embodiment that further describes the use of a flip-chip semiconductor die 220 is described in greater detail below.

The interconnect pads 244 are electrically coupled to a bonding pad 246 by an interconnect line 249. According to an embodiment, the interconnect lines 249 are formed in a meandering pattern in order to allow for the interconnects to stretch as the stretchable device 200 is stretched. In the illustrated embodiment, the meandering pattern is a repetitive switchback pattern, though other meandering patterns that allow for the interconnect lines 249 to stretch as the stretchable device 200 is stretched may also be used. Embodiments of the invention include a meandering pattern that allows for the interconnect lines 249 to stretch approximately 40% or greater without failing (i.e., the length of the fully stretched interconnect lines 249 along the stretched dimension may be approximately 40% longer than the un-stretched length of the interconnect lines 249). Additional embodiments include a meandering pattern that allows for the interconnect lines 249 to stretch between approximately 45% and 55% without failing. The interconnect lines 249 may be any commonly used conductive material for interconnect lines. For example, the interconnect lines 249 may be copper, silver, gold, or alloys thereof. Additional embodiments may further include interconnect lines 249 that are a conductive stack of materials, such as, but not limited to adhesion promoters, seed layers, and oxidation inhibitors.

Embodiments of the invention further include a strain redistribution layer 230. The strain redistribution layer 230 is illustrated as a dashed box in FIG. 2 in order to allow for the other details of the figure to be seen. The strain redistribution layer 230 provides a gradual transition in the modulus of the stretchable device 200 from the high modulus of the semiconductor die 220 to the low modulus of the stretchable substrate 210. As such, the strain differential between the stretchable substrate 210 and the semiconductor die 220 is buffered by the strain redistribution layer 230, and thereby reduces the stress in the wire bonds 247, interconnect pads 244, and interconnect lines 249 proximate to the junction between the semiconductor die 220 and the stretchable substrate 210. The reduction in stress reduces the probability that the components will fracture during cyclical stretching of the stretchable device 200.

According to an embodiment, a modulus of the strain redistribution layer 230 may be less than the modulus of the semiconductor die 220 and greater than the modulus of the stretchable substrate 210. In an embodiment, the elastic modulus of the strain redistribution layer 230 is at least one order of magnitude less than the elastic modulus of the semiconductor die 220 and at least one order of magnitude greater than the elastic modulus of the stretchable substrate 210. For example, the elastic modulus of the strain redistribution layer 230 may be between approximately 100 MPa and 10 GPa. By way of example, and not by way of limitation, the strain redistribution layer 230 may be polyimide (PI), polyethylene terephthalate (PET), Ajinomoto build-up film (ABF), wafer-level photoresists (WPR), benzocyclobutene (BCB), or the like.

In addition to providing the proper modulus to allow for a gradual transition between the high modulus of the semiconductor die 220 and the low modulus of the stretchable substrate 210, the strain redistribution layer 230 should also have good adhesion with the stretchable substrate 210. Good adhesion between the stretchable substrate 210 and the strain redistribution layer 230 allows for the stress from the stretchable substrate 210 to be transferred to the strain redistribution layer 230. For example, if there is poor adhesion between the materials, then the strain redistribution 230 layer may crack or delaminate from the stretchable substrate 210. In such situations, the stress from the stretchable substrate 210 is not transferred to strain redistribution layer 230 as effectively, and the gradual transition from the high modulus of the semiconductor die 220 and the low modulus of the stretchable substrate 210 is lost. Accordingly, embodiments of the invention include a strain redistribution layer 230 that adheres to the stretchable substrate 210 such that substantially no cracking occurs in the strain redistribution layer 230 during cyclic stretching of the stretchable device 200. Additional embodiments include a strain redistribution layer 230 that adheres to the stretchable substrate 210 such that substantially no delamination between the strain redistribution layer 230 and the stretchable substrate 210 occurs during cyclic stretching of the stretchable device 200.

The strain redistribution layer 230 includes footprint (i.e., an outer perimeter) that covers semiconductor die 220 and at least a portion of the interconnect lines 249. According to an embodiment, the strain redistribution layer 230 has an outer edge that extends over a portion of the interconnect lines 249 a distance L. The distance L is chosen such that the strain redistribution layer 230 covers a region of the interconnect lines 249 that is susceptible to high strains due to the transition from the high modulus of the semiconductor die 220 to the low modulus of the stretchable substrate 210. According to an embodiment, the distance L may be greater than approximately 25 µm. In a specific embodiment, the distance L may be between approximately 50 µm and 1,000 µm.

According to an embodiment, the strain redistribution layer 230 may be positioned above the semiconductor die 220, below the semiconductor die 220, or above and below the semiconductor die 220. The position of the stain redistribution layer 230 with respect to the semiconductor die 220 is discussed in greater detail below with respect to FIGS. 3A-3C.

Figure 3A:
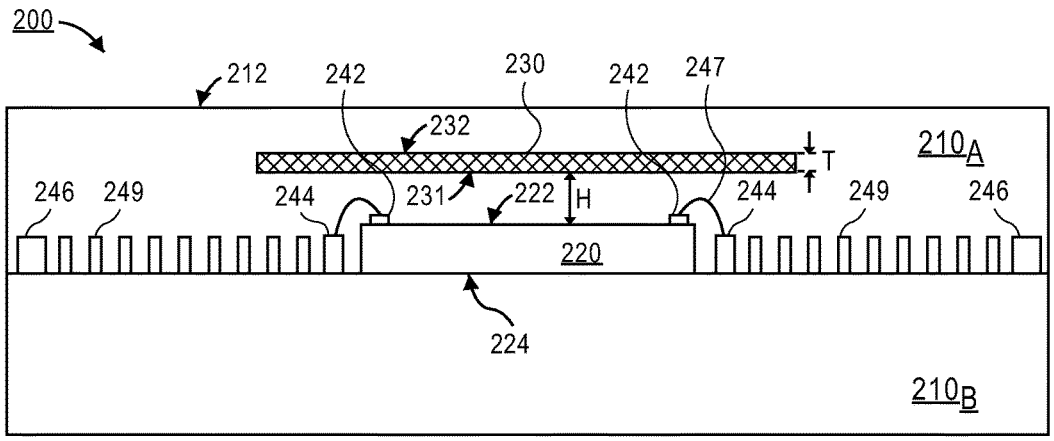
FIG. 3A is a cross-sectional view of the stretchable device in FIG. 2 in which the strain redistribution layer is positioned above the semiconductor die, according to an embodiment of the invention.

Embodiments of the invention include a semiconductor die 220 that is encapsulated within the stretchable substrate 210, as is illustrated in FIG. 3A. FIG. 3A is a cross-sectional view of the stretchable device 200 in FIG. 2 along the line 3-3'. According to an embodiment, the stretchable substrate 210 is split into an upper region $210_A$ and a lower region $210_B$. In an embodiment, a die backside surface 224 is substantially coplanar with the bottom surface of the upper region $210_A$ of the stretchable substrate. The junction between the upper region $210_A$ and the lower region $210_B$ is a remnant of the processing operations used to form the stretchable device 200, and will be described in greater detail below. According to an embodiment, the upper region $210_A$ and the lower region $210_B$ are formed with the same material. Forming both regions with the same material increases the adhesion between the two regions, and provides matching modulus values. However, it is to be appreciated that embodiments of the invention may further include a stretchable substrate 210 that includes a lower region $210_B$ that is formed with a different material than the upper region $210_A$. In FIG. 3A, the interconnect lines 249 are illustrated as being discontinuous. However, it is to be appreciated that the portions of the interconnect lines 249 illustrated in FIG. 3A are connected in a third dimension and form a continuous meandering pattern that electrically couples the interconnect pad 244 to the contact pad 246.

As shown in the embodiment illustrated in FIG. 3A, the strain redistribution layer 230 is positioned above the semiconductor die 220. The strain redistribution layer 230 is embedded within the upper portion of the stretchable substrate $210_A$. Embedding the strain redistribution layer 230 within the stretchable substrate 210 increases the adhesion between the two layers because the bottom surface 231 and top surface 232 of the strain redistribution layer 230 are both in contact with the stretchable substrate 210. As such, the stress from the stretchable substrate 210 is able to be transferred more effectively into the strain redistribution layer 230.

According to an embodiment, the strain redistribution layer 230 is spaced apart from a top surface 222 of the semiconductor die 220 by a distance H. The distance H may be chosen to provide the desired strain redistribution effect to the stretchable device 200. For example, as H increases, less stress is transferred to the strain redistribution layer 230. In an embodiment, the distance H is large enough to allow for the strain redistribution layer 230 to be positioned above the wire bonds 247. In an embodiment, H may be chosen such that the top surface 232 of the strain redistribution layer 230 is substantially coplanar with a top surface 212 of the upper portion of the stretchable substrate $210_A$.

The stiffness of the strain redistribution layer 230 may also be modulated by altering the thickness T of the strain redistribution layer 230. As the thickness T increases, the stiffness of the strain redistribution layer 230 increases. Increasing the stiffness of the strain redistribution layer 230 allows for more stress to be transferred to the strain redistribution layer 230. For example, the thickness T may be between approximately 5 µm and 50 µm. In a specific embodiment, the thickness T may be between 20 µm and 30 µm. The minimum thickness T of the redistribution layer 230 may be controlled by the processing operations used to form the strain redistribution layer 230. For example, when the strain redistribution layer 230 is formed with a spin-coating process, the minimum thickness may be approximately 5 µm, whereas when the strain redistribution layer 230 is formed with a lamination process, the minimum thickness may be approximately 10 µm.

In an additional embodiment, the strain redistribution layer 230 may be a plurality of layers (not shown). In one embodiment, the plurality of layers may have different moduli. For example, the moduli of each layer in the strain redistribution layer 230 may be graded, so that a first layer of the strain redistribution layer 230 closest to the semiconductor die 220 has a higher modulus than a second layer of the strain redistribution layer 230 furthest from the semiconductor die 220. According to an additional embodiment, the strain redistribution layer 230 may be a single layer that has a graded composition. For example, a bottom surface 231 of the strain redistribution layer 230 may have a first composition that produces a modulus that is greater than a modulus at a top surface 232 of the strain redistribution layer 230 that is produced by a second composition.

Figure 3B:
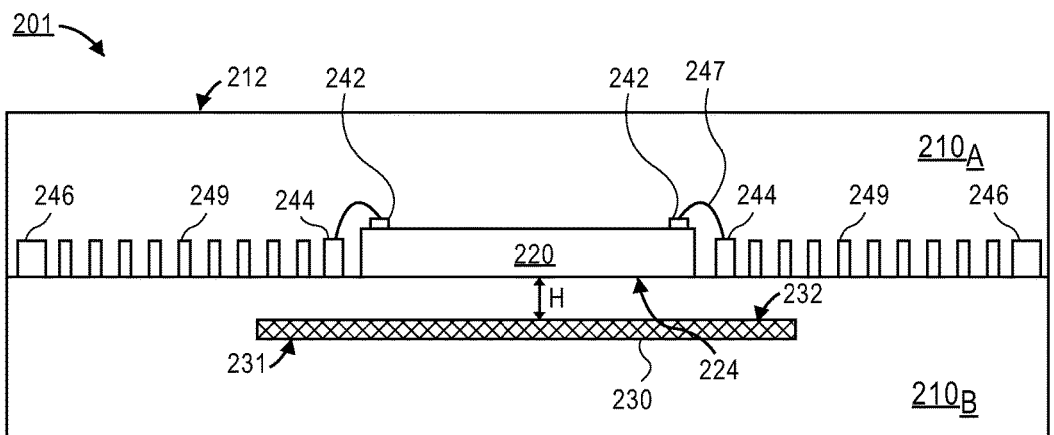
FIG. 3B is a cross-sectional view of the stretchable device in FIG. 2 in which the strain redistribution layer is positioned below the semiconductor die, according to an embodiment of the invention.

Referring now to FIG. 3B, a cross-sectional view of a stretchable device 201 according to an additional embodiment of the invention is illustrated. Stretchable device 201 is substantially similar to the stretchable device 200 illustrated in FIGS. 2A and 2B, with the exception of the location of the strain redistribution layer 230. As illustrated, the strain redistribution layer 230 encapsulated within the lower portion of the stretchable substrate $210_B$ and is positioned below the semiconductor die 230. The strain redistribution layer 230 may be spaced apart from the bottom surface 224 of the semiconductor die 230 by a distance H. The distance H may be chosen to provide the desired strain redistribution effect to the stretchable device 201. For example, as H increases, less stress is transferred to the strain redistribution layer 230. In an embodiment, the distance H may be substantially 0 µm (i.e., a top surface 232 of the strain redistribution layer 230 is in contact with the a bottom surface 224 of the semiconductor die 220). In an additional embodiment, H may be chosen such that a bottom surface 231 of the strain redistribution layer 230 is substantially coplanar with a bottom surface 211 of the lower portion of the stretchable substrate $210_B$.

Figure 3C:
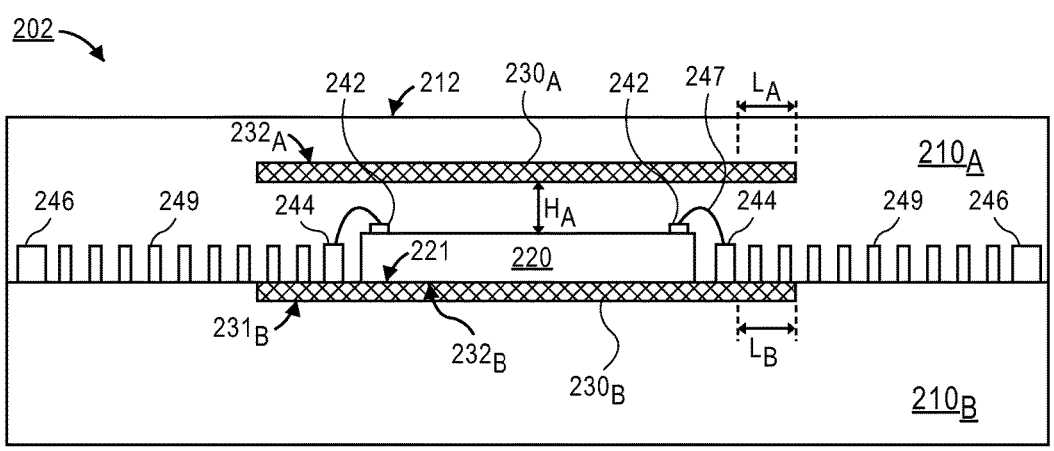
FIG. 3C is a cross-sectional view of the stretchable device in FIG. 2 in which a first strain redistribution layer is positioned above the semiconductor die and a second strain redistribution layer is positioned below the semiconductor die, according to an embodiment of the invention.

Referring now to FIG. 3C, a cross-sectional view of a stretchable device 202 according to an additional embodiment of the invention is illustrated. Stretchable device 202 is substantially similar to the stretchable device 200 illustrated in FIG. 3A, with the exception that there is a first strain redistribution layer $230_A$ positioned above the semiconductor die 220 and a second strain redistribution layer $230_B$ positioned below the semiconductor die 220. The inclusion of two strain redistribution layers $230_A$ and $230_B$ allow for an increase in the amount of stress that can be transferred from the stretchable substrate 210.

In the illustrated embodiment the first strain redistribution layer $230_A$ is spaced apart from a top surface of the semiconductor die 220 by a distance $H_A$. The distance $H_A$ may be chosen such that it provides the desired amount of strain reduction in the stretchable device 202. For example, the distance $H_A$ may be chosen such that the first strain redistribution layer $230_A$ is above a top surface of the wire bonds 247. The distance $H_A$ may also be chosen such that a top surface $232_A$ of the first strain redistribution layer $230_A$ is substantially coplanar with a top surface 212 of the upper portion of the stretchable substrate $210_A$. In the illustrated embodiment, the second strain redistribution layer $230_B$ is positioned such that a top surface $232_B$ of the second strain redistribution layer $230_B$ is in contact with a bottom surface 221 of the semiconductor die 220. According to an embodiment, the second strain redistribution layer $230_B$ may be spaced away from the bottom surface 221 of the semiconductor die by a distance $H_B$ (not shown). For example, $H_B$ may be chosen such that a bottom surface $231_B$ of the second strain redistribution layer $230_B$ is substantially coplanar with a bottom surface 211 of the lower portion of the stretchable substrate $210_B$. According to an embodiment, the distance $H_A$ and $H_B$ may be substantially equal to each other. Alternatively, the distance $H_A$ may be greater than or less than distance $H_B$.

According to an embodiment, the first strain redistribution layer $230_A$ may extend over the interconnect lines 249 a distance $L_A$ and the second strain redistribution layer $230_B$ may extend over the interconnect lines 249 a distance $L_B$. In an embodiment, the distances $L_A$ and $L_B$ may be equal to each other. Alternatively, distance $L_A$ may be less than or greater than the distance $L_B$.

Figure 4:
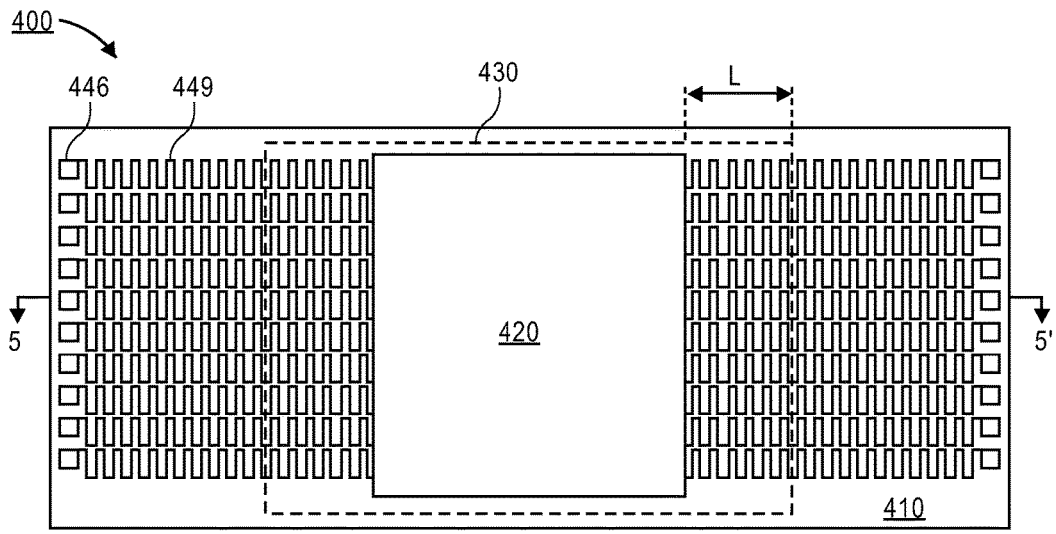
FIG. 4 is an overhead view of a stretchable device that includes a flip-chip semiconductor die and a strain redistribution layer encapsulated in a stretchable substrate, according to an embodiment of the invention.
Figure 5A:
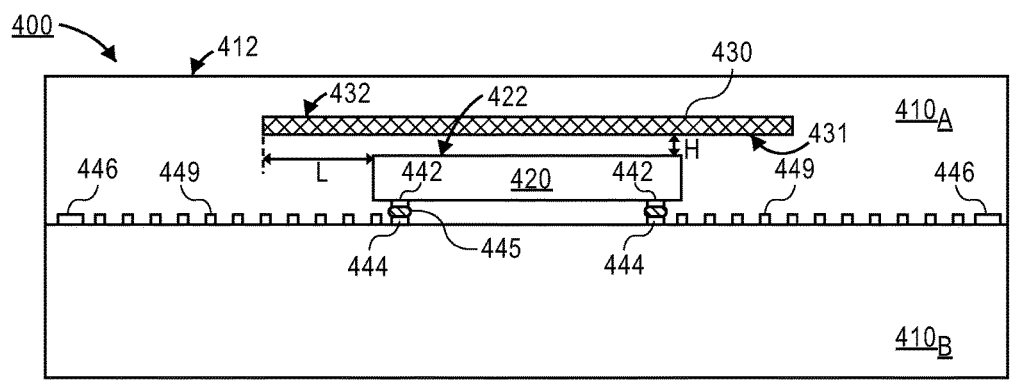
FIG. 5A is a cross-sectional view of the stretchable device in FIG. 4 in which the strain redistribution layer is positioned above the semiconductor die, according to an embodiment of the invention.

Referring now to FIG. 4, a plan view of a stretchable device 400 according to an additional embodiment is illustrated. The stretchable device 400 is substantially similar to the stretchable device 200 illustrated in FIG. 2, with the exception that the semiconductor die is a flip-chip die instead of a wire bond die. Accordingly, the die contacts (not shown in FIG. 4) are formed on a bottom surface of the semiconductor die 420. Referring briefly to FIG. 5A, a cross-sectional illustration along the line 5-5' in FIG. 4 illustrates the flip-chip connection. As illustrated, the die contacts 442 are electrically coupled to interconnect pads 444 by solder connections 445. By way of example, the solder connections may be controlled collapsed chip connection (C4) bumps. Returning to FIG. 4, the interconnect lines 449 extend below the semiconductor die 420 to provide a connection to the interconnect pads 444 below the die contacts 442.

As the stretchable device 400 is stretched the portion of the interconnect lines that are under the greatest degree of stress is proximate to the junction between the semiconductor die 420 and the stretchable substrate 410, as described above. Accordingly, the strain redistribution layer 430 includes footprint (i.e., an outer perimeter) that covers semiconductor die 420 and at least a portion of the interconnect lines 449. According to an embodiment, the strain redistribution layer 430 has an outer edge that extends out from the edge of the semiconductor die 420 and over a portion of the interconnect lines 449 a distance L. The distance L is chosen such that the strain redistribution layer 430 covers a region of the interconnect lines 449 that is susceptible to high stress due to the transition from the high modulus of the semiconductor die 420 to the low modulus of the stretchable substrate 410. According to an embodiment, the distance L may be greater than approximately 25 µm. In a specific embodiment, the distance L may be between approximately 50 µm and 1,000 µm.

According to an embodiment, the strain redistribution layer 430 may be positioned above the semiconductor die 420, below the semiconductor die 420, or above and below the semiconductor die 420. The position of the stain redistribution layer 430 with respect to the semiconductor die 420 is discussed in greater detail below with respect to FIGS. 5A-5C.

Embodiments of the invention include a semiconductor die 420 that is encapsulated within the stretchable substrate 410, as is illustrated in FIG. 5A. FIG. 5A is a cross-sectional view of the stretchable device 400 in FIG. 4 along the line 5-5'. Aside from the replacement of a wire bonded semiconductor die with a flip-chip semiconductor die 420, FIG. 5A is substantially similar to the stretchable device 200 illustrated in FIG. 3A. As shown in the embodiment illustrated in FIG. 5A, the strain redistribution layer 430 is positioned above the semiconductor die 420. The strain redistribution layer 430 is embedded within the upper portion of the stretchable substrate $410_A$. Embedding the strain redistribution layer 430 within the stretchable substrate 410 increases the adhesion between the two layers because the bottom surface 431 and top surface 432 of the strain redistribution layer 430 are both in contact with the stretchable substrate 410. As such, the stress from the stretchable substrate 410 is able to be transferred more effectively into the strain redistribution layer 430.

According to an embodiment, the strain redistribution layer 430 is spaced apart from a top surface 422 of the semiconductor die 420 by a distance H. The distance H may be chosen to provide the desired strain redistribution effect to the stretchable device 400. For example, as H increases, less stress is transferred to the strain redistribution layer 430. In an embodiment, the distance H may be zero (i.e., the strain redistribution layer 430 may be positioned such that a bottom surface 431 of the strain redistribution layer 430 is in contact with a top surface 422 of the semiconductor die 420). In an embodiment, H may be chosen such that the top surface 432 of the strain redistribution layer 430 is substantially coplanar with a top surface 412 of the upper portion of the stretchable substrate $410_A$.

Figure 5B:
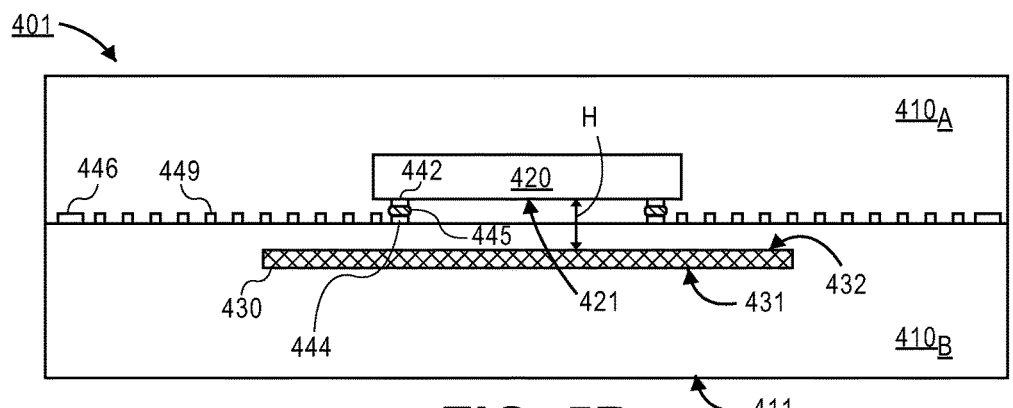
FIG. 5B is a cross-sectional view of the stretchable device in FIG. 4 in which the strain redistribution layer is positioned below the semiconductor die, according to an embodiment of the invention.

Referring now to FIG. 5B, a cross-sectional view of a stretchable device 401 according to an additional embodiment of the invention is illustrated. Stretchable device 401 is substantially similar to the stretchable device 400 illustrated in FIG. 5A, with the exception of the location of the strain redistribution layer 430. As illustrated, the strain redistribution layer 430 is encapsulated within the lower portion of the stretchable substrate $410_B$ and is positioned below the semiconductor die 420. The strain redistribution layer 430 may be spaced apart from the bottom surface 421 of the semiconductor die 420 by a distance H. The distance H may be chosen to provide the desired strain redistribution effect to the stretchable device 401. For example, as H increases, less stress is transferred to the strain redistribution layer 430. In an embodiment, the distance H may be chosen such that a top surface 432 of the strain redistribution layer 430 is in contact with bottom surfaces of the interconnect pads 444 and/or bottom surfaces of the interconnect lines 449. In an additional embodiment, H may be chosen such that a bottom surface 431 of the strain redistribution layer 430 is substantially coplanar with a bottom surface 411 of the lower portion of the stretchable substrate $410_B$.

Figure 5C:
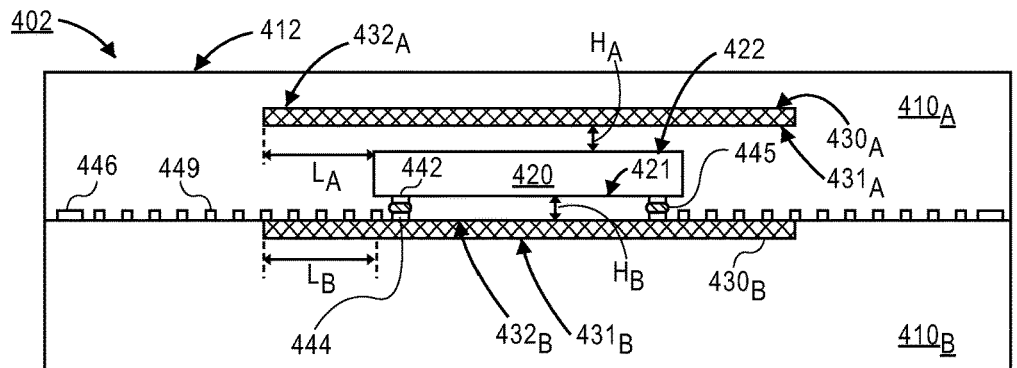
FIG. 5C is a cross-sectional view of the stretchable device in FIG. 4 in which a first strain redistribution layer is positioned above the semiconductor die and a second strain redistribution layer is positioned below the semiconductor die, according to an embodiment of the invention.

Referring now to FIG. 5C a cross-sectional view of a stretchable device 402 according to an additional embodiment of the invention is illustrated. Stretchable device 402 is substantially similar to the stretchable device 400 illustrated in FIG. 5A, with the exception that there is a first strain redistribution layer $430_A$ positioned above the semiconductor die 420 and a second strain redistribution layer $430_B$ positioned below the semiconductor die 420. The inclusion of two strain redistribution layers $430_A$ and $430_B$ allows for an increase in the amount of stress that can be transferred from the stretchable substrate 410.

In the illustrated embodiment the first strain redistribution layer $430_A$ is spaced apart from a top surface of the semiconductor die 420 by a distance $H_A$. The distance $H_A$ may be chosen such that it provides the desired amount of strain reduction in the stretchable device 402. In an embodiment, the distance $H_A$ may be zero (i.e., the strain redistribution layer 430 may be positioned such that a bottom surface 431 of the strain redistribution layer 430 is in contact with a top surface 422 of the semiconductor die 420). The distance $H_A$ may also be chosen such that a top surface $432_A$ of the first strain redistribution layer $430_A$ is substantially coplanar with a top surface 412 of the upper portion of the stretchable substrate $410_A$. In the illustrated embodiment, the second strain redistribution layer $430_B$ is spaced away from the bottom surface 421 of the semiconductor die 420 a distance $H_B$ such that a top surface $432_B$ of the second strain redistribution layer $430_B$ is in contact with bottom surfaces of the interconnect pads 444 and/or bottom surfaces of the interconnect lines 449. In An additional embodiment, $H_B$ may be chosen such that a bottom surface 431 of the strain redistribution layer 430 is substantially coplanar with a bottom surface 411 of the lower portion of the stretchable substrate $410_B$. According to an embodiment, the distance $H_A$ and $H_B$ may be substantially equal to each other. Alternatively, the distance $H_A$ may be greater than or less than the distance $H_B$.

According to an embodiment, the first strain redistribution layer $430_A$ may extend over the interconnect lines 449 a distance $L_A$ and the second strain redistribution layer $430_B$ may extend over the interconnect lines 449 a distance $L_B$. In an embodiment, the distances $L_A$ and $L_B$ may be equal to each other. Alternatively, distance $L_A$ may be less than or greater than the distance $L_B$.

Additional embodiments of the invention may utilize a perforated strain redistribution layer in order to provide an even more gradual transition between the high modulus of the semiconductor die and the low modulus of the stretchable substrate. In a perforated strain redistribution layer, the effective stiffness of the strain redistribution layer may be lower proximate to the edges of the strain redistribution layer relative to the center of the strain redistribution layer. For example, the effective stiffness may be reduced by forming perforations proximate to the edge of the strain redistribution layer that are larger than perforations (if any) that are formed proximate to the center of the strain redistribution layer. Exemplary perforated strain redistribution layers according to such embodiments are illustrated in plan views 6A and 6B.

Figure 6A:
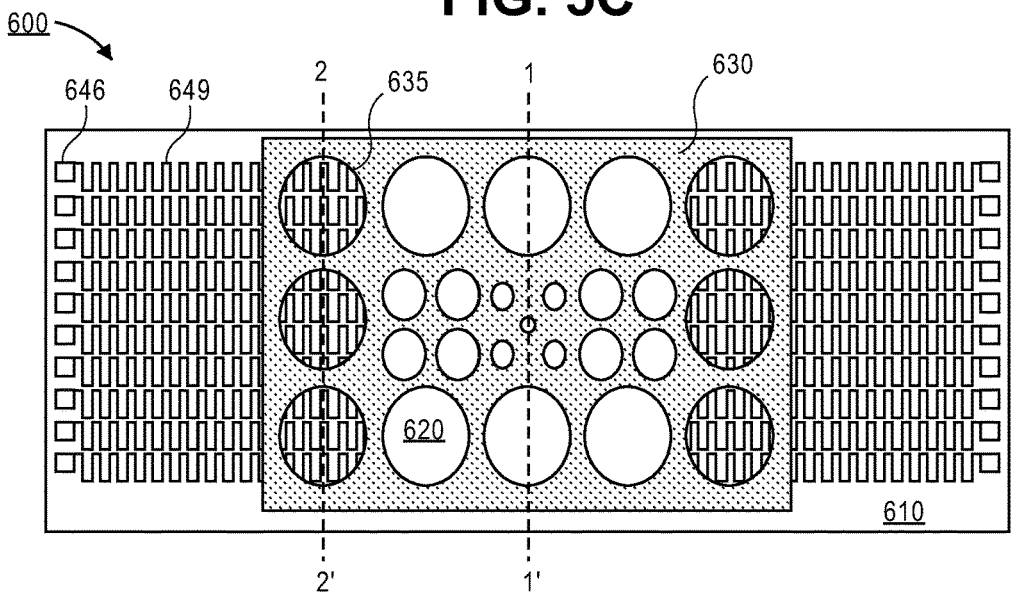
FIG. 6A is a plan view of a strain redistribution layer that includes a plurality of perforations, according to an embodiment of the invention.

Referring now to FIG. 6A, a perforated strain redistribution layer 630 is illustrated according to an embodiment of the invention. According to the illustrated embodiment, the perforations 635 are substantially circular in shape. However, it is to be appreciated that the perforations do not need to be circular. By way of example, and not by way of limitation, perforation shapes may also include, stripes, polygons, chevrons, oblong shapes, or any combination thereof. The perforations 635 remove material from the strain redistribution layer 630. As such, the effective stiffness of the layer is reduced as the cross-sectional area decreases. For example, the cross-sectional area along line 1-1' proximate to the center of the perforated strain redistribution layer 630 is greater than the cross-sectional area along line 2-2' proximate to the edge of the perforated strain redistribution layer 630.

Embodiments of the invention include reducing the effective stiffness of the perforated strain redistribution layer 630 so that it matches the effective stiffness of the stretchable substrate 610. For example, if the effective stiffness of an unperforated strain redistribution layer was ten times larger than the effective stiffness of the stretchable substrate 610, then the effective stiffness proximate to the edge of the perforated strain redistribution layer 630 may be approximately ten times less than the effective stiffness proximate to the center of the perforated strain redistribution layer 630. Additional embodiments include a perforated strain redistribution layer 630 that has an effective stiffness proximate to the edge of the strain redistribution layer 630 that is less than or greater than the effective stiffness of the stretchable substrate 610.

Figure 6B:
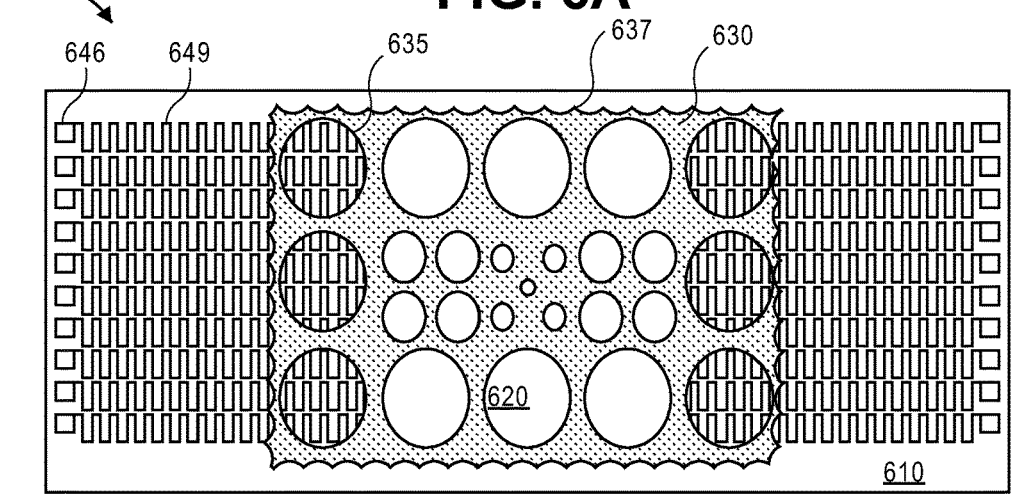
FIG. 6B is a plan view of a strain redistribution layer that includes a plurality of perforations and scalloped edges, according to an embodiment of the invention.

In addition to providing a more gradual decrease in the effective stiffness of the perforated strain redistribution layer 630, the perforations 635 also increase adhesion between the strain redistribution layer 630 and the stretchable substrate 610. The perforations 635 increase the surface area of the strain redistribution layer 630 to which stretchable substrate 610 contacts. Additionally, the perforations 635 may also provide mechanical anchoring between the layers. FIG. 6B is a plan view illustration of a perforated strain redistribution layer 630 that includes scalloped edges 637, in accordance with an additional embodiment of the invention. The scalloped edges 637 increase the surface area of the strain redistribution layer 630 to which the stretchable substrate 610 may adhere to and provides mechanical anchoring points along the edge of the strain redistribution layer 630. Accordingly, the adhesion between the two materials may be increased and, therefore, reduces the probability that the strain redistribution layer 630 will delaminate from the stretchable substrate 610 or fracture when the stretchable device is cyclically stretched.

According to an embodiment of the invention, the perforated strain redistribution layer 630 may be fabricated with a laser patterning process. In one embodiment, an ultra violet laser patterning process may be used to form the perforations 635 in the strain redistribution layer 630. In an alternative embodiment, an Excimer laser may be used with a mask that includes the pattern that will be transferred to the strain redistribution layer 630. In such an embodiment, the entire perforated pattern may be made in a single exposure. Additional embodiments may use a tape and reel process in conjunction with a laser patterning process in order to produce a plurality of perforated strain redistribution layers 630 in a substantially continuous process. One or more perforated strain redistribution layers 630 may then be used in accordance with embodiments of the invention.

Figure 7A:
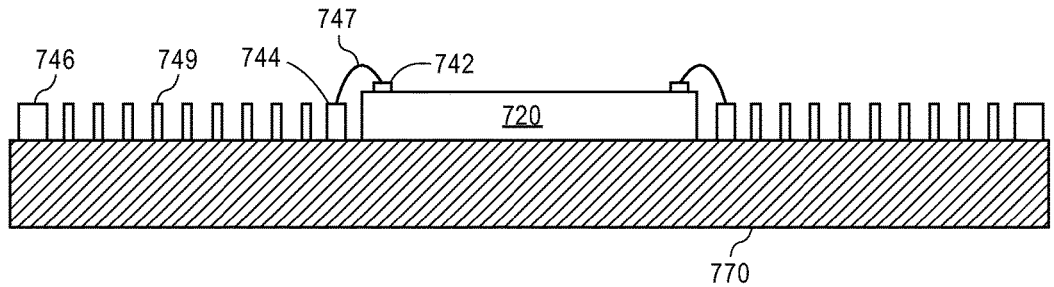
FIGS. 7A-7D are cross-sectional illustrations of processing operations that may be used to form stretchable devices according to embodiments of the invention.

Referring now to FIGS. 7A-7D, a series of cross-sectional illustrations are provided that illustrate various processing operations that may be used to form a stretchable device according to embodiments of the invention. FIG. 7A is a cross-sectional illustration of a wire-bonded die 720 positioned on a carrier substrate 770. The wire-bonded semiconductor die 720 is substantially similar to those described above and includes die contacts 742 that are electrically coupled to interconnect pads 744 by wire bonds 747. In an embodiment, the die contact 742 and the interconnect pads 744 may include a conductive stack of materials, such as, but not limited to adhesion promoters, seed layers, copper, silver, gold, or alloys thereof, and oxidation inhibitors. The wire bonds 747 may be any commonly used conductive material, such as copper, silver, gold, or alloys thereof.

Interconnect lines 749 may electrically couple the interconnect pads 744 to the contact pads 746. The interconnect lines 749 may be any commonly used conductive material for interconnect lines. For example, the interconnect lines 749 may be copper, silver, gold, or alloys thereof. Additional embodiments may further include interconnect lines 749 that are a conductive stack of materials, such as, but not limited to adhesion promoters, seed layers, and oxidation inhibitors. By way of example, the interconnect pads 744, the interconnect lines 749, and the contact pads 746 may be formed with typical interconnect formation processes known in the art, such as damascene processing, printing, or the like.

Figure 7B:
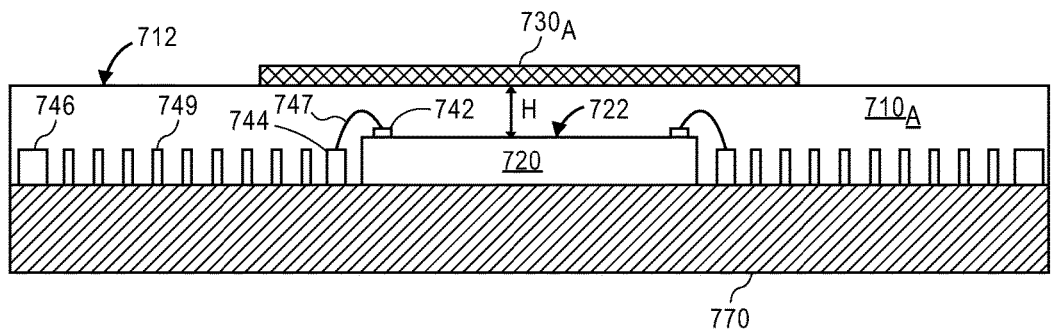
Figure 7C:
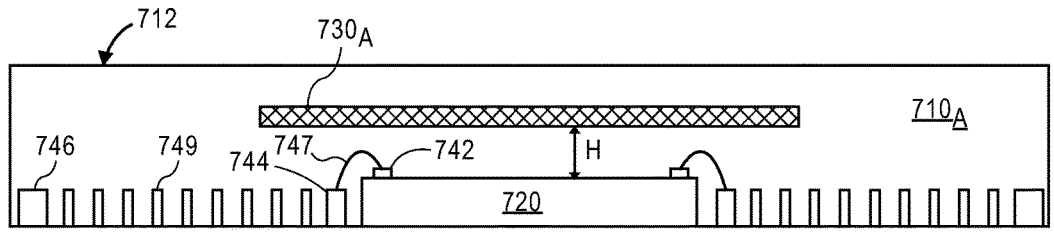

Thereafter, a first portion of the stretchable substrate layer 710 may be formed over the carrier substrate 770, as illustrated in FIG. 7B. In an embodiment, the first portion of the stretchable substrate $710_A$ may encapsulate the semiconductor die 720, the wire bonds 747, the interconnect pads 744, the interconnect lines 749, and the contact pads 746. The first portion of the stretchable substrate $710_A$ may be formed such that a top surface 712 of the first portion of the stretchable substrate 710 is a height H above a top surface 722 of the semiconductor die 720. In an embodiment, the stretchable substrate may be formed with a pouring process. For example, a precursor liquid may be poured over the wafer carrier 770 and then polymerized and cross-linked to form the stretchable substrate $710_A$. A strain redistribution layer 730 may then be placed on the top surface of the first portion of the stretchable substrate $710_A$ in accordance with an embodiment of the invention. According to some embodiments, a second portion of the stretchable substrate $710_A$ may be formed over the top surface of the first portion of the stretchable substrate $710_A$ and encapsulate the strain redistribution layer 730, as illustrated in FIG. 7C.

The wafer carrier 770 may be removed after the formation of the formation of the stretchable substrate $710_A$ is completed. By way of example, the wafer carrier 770 may be removed with a delamination process, an etching process, or any other processes known in the art.

Figure 7D:
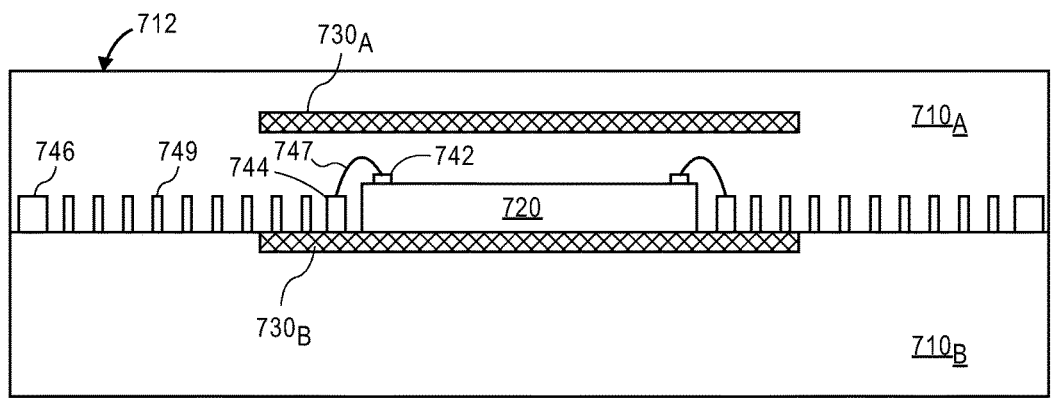

After the wafer carrier is removed, the lower portion $710_B$ of the stretchable substrate is formed. As illustrated in FIG. 7D, a second strain redistribution layer $730_B$ may be placed in contact with the bottom surface 721 of the semiconductor die 720. Thereafter, the bottom portion of the stretchable substrate $710_E$ may be formed over the second strain redistribution layer $730_B$ and over the remainder of the device. According to an additional embodiment, a first portion of the bottom portion of the stretchable substrate $710_E$ may be formed prior to the placing the second strain redistribution layer $730_B$ over the semiconductor die. In such embodiments, the strain redistribution layer $730_B$ may be spaced away from the bottom surface of the semiconductor die 710.

It is to be appreciated that the processing operations described above with respect to FIGS. 7A-7D are exemplary in nature, and that embodiments of the invention are not limited to implementing this process with wire bonded semiconductor dies. For example, a substantially similar process may also be used to form a stretchable device that includes a flip-chip semiconductor die.

Figure 8:
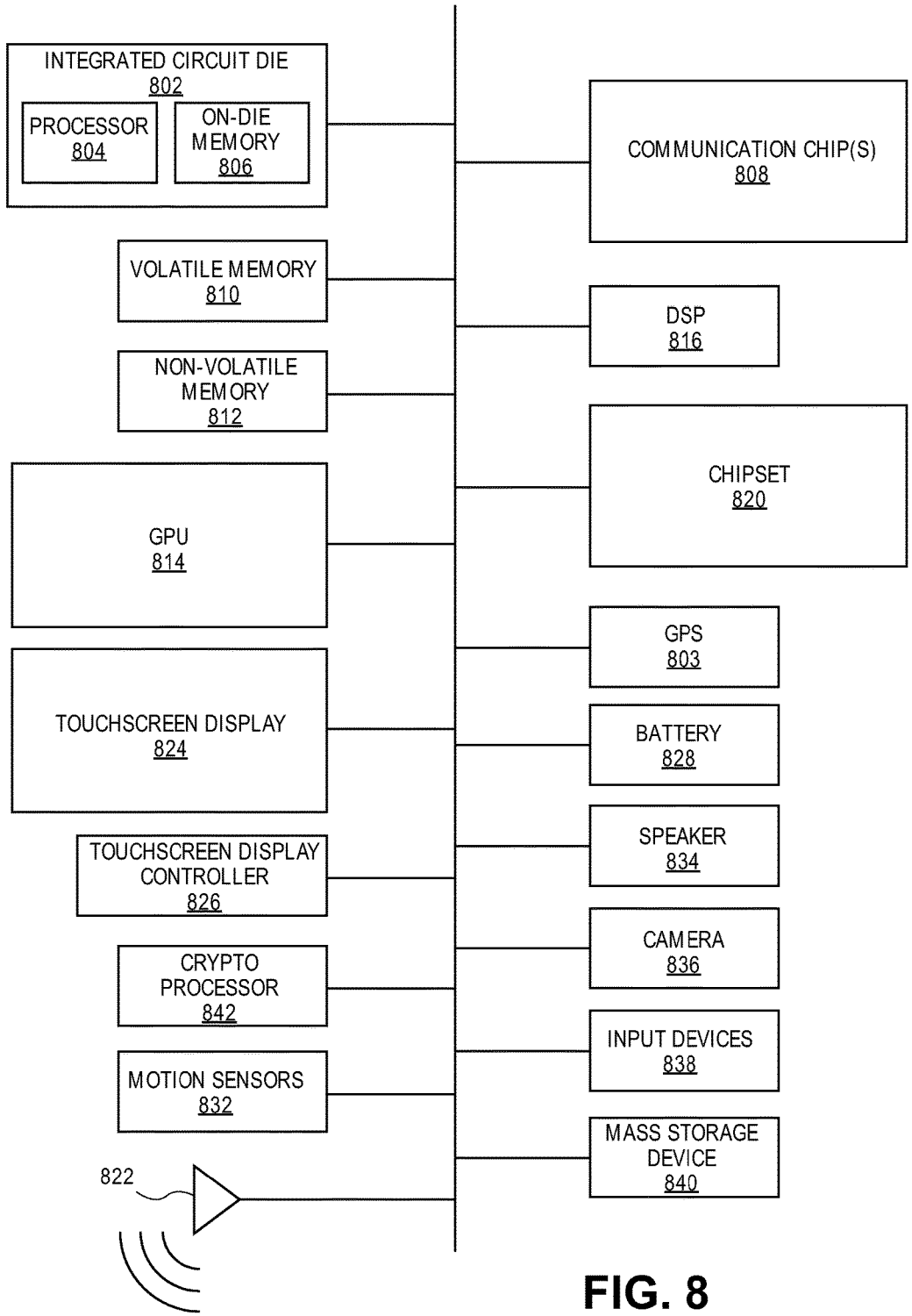
FIG. 8 is a schematic of a computing device built in accordance with an embodiment of the invention.

FIG. 8 illustrates a computing device 800 in accordance with one embodiment of the invention. By way of example, a stretchable device, such as those described herein may include additional components of a computing device 800, or be incorporated into a computing device 800. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The processor 804 of the computing device 800 includes one or more devices, such as transistors that are coupled to one or more interconnect lines that are formed in an interconnect structure that includes vias that are formed through pre-patterned features in an interconnect layer, according to an embodiment of the invention. The term "processor" may refer to any device or portion of a device that processes electronic data from registers and/or memory to transform that electronic data into other electronic data that may be stored in registers and/or memory.

The communication chip 808 may also include one or more devices, such as transistors that are coupled to one or more interconnect lines that are formed in an interconnect structure that includes vias that are formed through pre-patterned features in an interconnect layer, according to an embodiment of the invention.

In further embodiments, another component housed within the computing device 800 may contain one or more devices, such as transistors that are coupled to one or more interconnect lines that are formed in an interconnect structure that includes vias that are formed through pre-patterned features in an interconnect layer, according to an embodiment of the invention.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments. The various features of the different embodiments may be variously combined with some features included and others excluded to suit a variety of different applications. Some embodiments pertain to a microelectronic device comprising, a semiconductor die having one or more die contacts that are each electrically coupled to a contact pad by a conductive trace, wherein the semiconductor die has a first elastic modulus; an encapsulation layer over the semiconductor die and the conductive trace, wherein the encapsulation layer has a second elastic modulus that is less than the first elastic modulus; and a first strain redistribution layer within the encapsulation layer, wherein the first strain redistribution layer has a footprint that covers the semiconductor die and a portion of the conductive traces, wherein the strain redistribution layer has a third elastic modulus that is less than the first elastic modulus and greater than the second elastic modulus.

In further embodiments the semiconductor die is a wire-bonded die.

In further embodiments the semiconductor die is a flip-chip.

In further embodiments first strain redistribution layer is above the semiconductor die.

In further embodiments the first strain redistribution layer is below the semiconductor die.

In further embodiments the first strain redistribution layer contacts a backside of the semiconductor die.

In further embodiments the microelectronic device, further comprises a second strain redistribution layer.

In further embodiments the first strain redistribution layer is above the semiconductor die and the second strain redistribution layer is below the semiconductor die.

In further embodiments the first strain redistribution layer and the second strain redistribution layer have different footprints.

In further embodiments the first strain redistribution layer includes one or more perforations, wherein the perforations proximate to an outer perimeter of the first strain redistribution layer are larger than the perforations proximate to a center of the first strain redistribution layer.

In further embodiments the perforations are circular shaped perforations, stripe shaped perforations, or chevron shaped perforations.

In further embodiments the outer perimeter of the first strain redistribution layer is scalloped.

In further embodiments the encapsulation layer is polydimethylsiloxane (PDMS), or polyurethane.

In further embodiments the first strain redistribution layer is polyimide (PI), polyethylene terephthalate (PET), Ajinomoto build-up film (ABF), wafer-level photoresists (WPR), benzocyclobutene (BCB).

In further embodiments the footprint of the first strain redistribution layer extends 50 μm or more over the conductive traces.

In further embodiments the first strain redistribution layer has a graded modulus.

In further embodiments the first strain redistribution layer is comprised of a plurality of layers, wherein the moduli of the plurality of layers are graded.

In further embodiments the first elastic modulus is an order of magnitude greater than the third elastic modulus, and wherein the third elastic modulus is an order of magnitude grade than the second elastic modulus.

Some embodiments pertain to a method of forming a microelectronic device comprising, attaching a semiconductor die to a carrier substrate that includes a plurality of conductive traces, wherein one or more die contacts on the semiconductor die are electrically coupled to the contact pad by the conductive traces; forming an encapsulation layer over the semiconductor die, and the carrier substrate; forming a first strain redistribution layer over a top surface of the encapsulation layer; removing the carrier substrate; and forming a second encapsulation layer below the semiconductor die.

In further embodiments the method of forming a microelectronic device further comprises, forming a second strain redistribution layer over an exposed backside surface of the semiconductor die prior to forming the second encapsulation layer.

In further embodiments the semiconductor die is a wire-boned die or a flip-chip.

In further embodiments the semiconductor die has a first elastic modulus, the first encapsulation layer has a second elastic modulus, and the strain redistribution layer has a third elastic modulus, and wherein the first elastic modulus is greater than the third elastic modulus, and wherein the third elastic modulus is greater than the second elastic modulus.

Some embodiments pertain to a microelectronic device comprising, a semiconductor die having one or more die contacts that are each electrically coupled to a contact pad by a conductive trace, wherein the semiconductor die has a first elastic modulus; an encapsulation layer over the semiconductor die and the conductive trace, wherein the encapsulation layer has a second elastic modulus that is less than the first elastic modulus; and a first strain redistribution layer within the encapsulation layer, wherein the first strain redistribution layer has a footprint that covers the semiconductor die and a portion of the conductive traces, wherein the strain redistribution layer has a third elastic modulus that is less than the first elastic modulus and greater than the second elastic modulus, wherein the first elastic modulus is an order of magnitude greater than the third elastic modulus, and wherein the third elastic modulus is an order of magnitude grade than the second elastic modulus, and wherein the first strain redistribution layer includes one or more perforations, wherein the perforations proximate to an outer perimeter of the first strain redistribution layer are larger than the perforations proximate to a center of the first strain redistribution layer.

In further embodiments the microelectronic device further comprises, a second strain redistribution layer.

In further embodiments the first strain redistribution layer is above the semiconductor die and the second strain redistribution layer is below the semiconductor die.

What is claimed is:

1. A microelectronic device comprising:
   a semiconductor die having one or more die contacts that are each electrically coupled to a contact pad by a conductive trace, wherein the semiconductor die has a first elastic modulus;
   an encapsulation layer over the semiconductor die and the conductive trace, wherein the encapsulation layer has a second elastic modulus that is less than the first elastic modulus; and
   a first strain redistribution layer within the encapsulation layer, wherein the first strain redistribution layer has a footprint that covers the semiconductor die and a portion of the conductive traces, wherein the strain redistribution layer has a third elastic modulus that is less than the first elastic modulus and greater than the second elastic modulus.

2. The microelectronic device of claim 1, wherein the semiconductor die is a wire-bonded die.

3. The microelectronic device of claim 1, wherein the semiconductor die is a flip-chip.

4. The microelectronic device of claim 1, wherein the first strain redistribution layer is above the semiconductor die.

5. The microelectronic device of claim 1, wherein the first strain redistribution layer is below the semiconductor die.

6. The microelectronic device of claim 5, wherein the first strain redistribution layer contacts a backside of the semiconductor die.

7. The microelectronic device of claim 1, further comprising a second strain redistribution layer.

8. The microelectronic device of claim 7, wherein the first strain redistribution layer is above the semiconductor die and the second strain redistribution layer is below the semiconductor die.

9. The microelectronic device of claim 8, wherein the first strain redistribution layer and the second strain redistribution layer have different footprints.

10. The microelectronic device of claim 1, wherein the first strain redistribution layer includes one or more perforations, wherein the perforations proximate to an outer perimeter of the first strain redistribution layer are larger than the perforations proximate to a center of the first strain redistribution layer.

11. The microelectronic device of claim 10, wherein the perforations are circular shaped perforations, stripe shaped perforations, or chevron shaped perforations.

12. The microelectronic device of claim 10, wherein the outer perimeter of the first strain redistribution layer is scalloped.

13. The microelectronic device of claim 1, wherein the encapsulation layer is polydimethylsiloxane (PDMS), or polyurethane.

14. The microelectronic device of claim 1, wherein the first strain redistribution layer is polyimide (PI), polyethylene terephthalate (PET), Ajinomoto build-up film (ABF), wafer-level photoresists (WPR), benzocyclobutene (BCB).

15. The microelectronic device of claim 1, wherein the footprint of the first strain redistribution layer extends 50 μm or more over the conductive traces.

16. The microelectronic device of claim 1, wherein the first strain redistribution layer has a graded modulus.

17. The microelectronic device of claim 16, wherein the first strain redistribution layer is comprised of a plurality of layers, wherein the moduli of the plurality of layers are graded.

18. The microelectronic device of claim 1, wherein the first elastic modulus is an order of magnitude greater than the third elastic modulus, and wherein the third elastic modulus is an order of magnitude grade than the second elastic modulus.

19. A microelectronic device comprising:
a semiconductor die having one or more die contacts that are each electrically coupled to a contact pad by a conductive trace, wherein the semiconductor die has a first elastic modulus;
an encapsulation layer over the semiconductor die and the conductive trace, wherein the encapsulation layer has a second elastic modulus that is less than the first elastic modulus; and a first strain redistribution layer within the encapsulation layer, wherein the first strain redistribution layer has a footprint that covers the semiconductor die and a portion of the conductive traces, wherein the strain redistribution layer has a third elastic modulus that is less than the first elastic modulus and greater than the second elastic modulus, wherein the first elastic modulus is an order of magnitude greater than the third elastic modulus, and wherein the third elastic modulus is an order of magnitude grade than the second elastic modulus, and wherein the first strain redistribution layer includes one or more perforations, wherein the perforations proximate to an outer perimeter of the first strain redistribution layer are larger than the perforations proximate to a center of the first strain redistribution layer.

20. The microelectronic device of claim 19, further comprising a second strain redistribution layer.

21. The microelectronic device of claim 20, wherein the first strain redistribution layer is above the semiconductor die and the second strain redistribution layer is below the semiconductor die.

* * * * *